United States Patent
Okamura

(10) Patent No.: US 9,202,980 B2
(45) Date of Patent: Dec. 1, 2015

(54) LIGHT EMITTING CHIP

(71) Applicant: DISCO CORPORATION, Tokyo (JP)

(72) Inventor: Takashi Okamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/566,942

(22) Filed: Dec. 11, 2014

(65) Prior Publication Data

US 2015/0179885 A1   Jun. 25, 2015

(30) Foreign Application Priority Data

Dec. 20, 2013   (JP) ................. 2013-263245

(51) Int. Cl.
*H01L 33/32* (2010.01)
*H01L 33/58* (2010.01)

(52) U.S. Cl.
CPC ............. *H01L 33/32* (2013.01); *H01L 33/58* (2013.01)

(58) Field of Classification Search
USPC ........................................... 257/76
See application file for complete search history.

(56) References Cited

U.S. PATENT DOCUMENTS

2010/0147358 A1*  6/2010  Ohtorii ................ 136/244

FOREIGN PATENT DOCUMENTS

JP        04-010670        1/1992

* cited by examiner

*Primary Examiner* — Zandra Smith
*Assistant Examiner* — Lawrence Tynes, Jr.
(74) *Attorney, Agent, or Firm* — Greer Burns & Crain Ltd.

(57) ABSTRACT

A light emitting chip of the present invention includes a device chip having a sapphire substrate and a light emitting layer formed over the front surface of the sapphire substrate and a transparent member bonded to the back surface of the sapphire substrate by a resin transmissive to emitted light from the light emitting layer. The transparent member is transmissive to the emitted light from the light emitting layer. A groove is formed in an abutting surface of the transparent member against the device chip in such a manner as to be exposed to the side surface and the abutting surface of the transparent member. The groove width of the groove is smaller than the length of one side of the device chip.

4 Claims, 6 Drawing Sheets

(Comparative example)   (Working example 1)   (Working example 2)   (Working example 3)

(Working example 4)   (Working example 5)   (Working example 6)   (Working example 7)

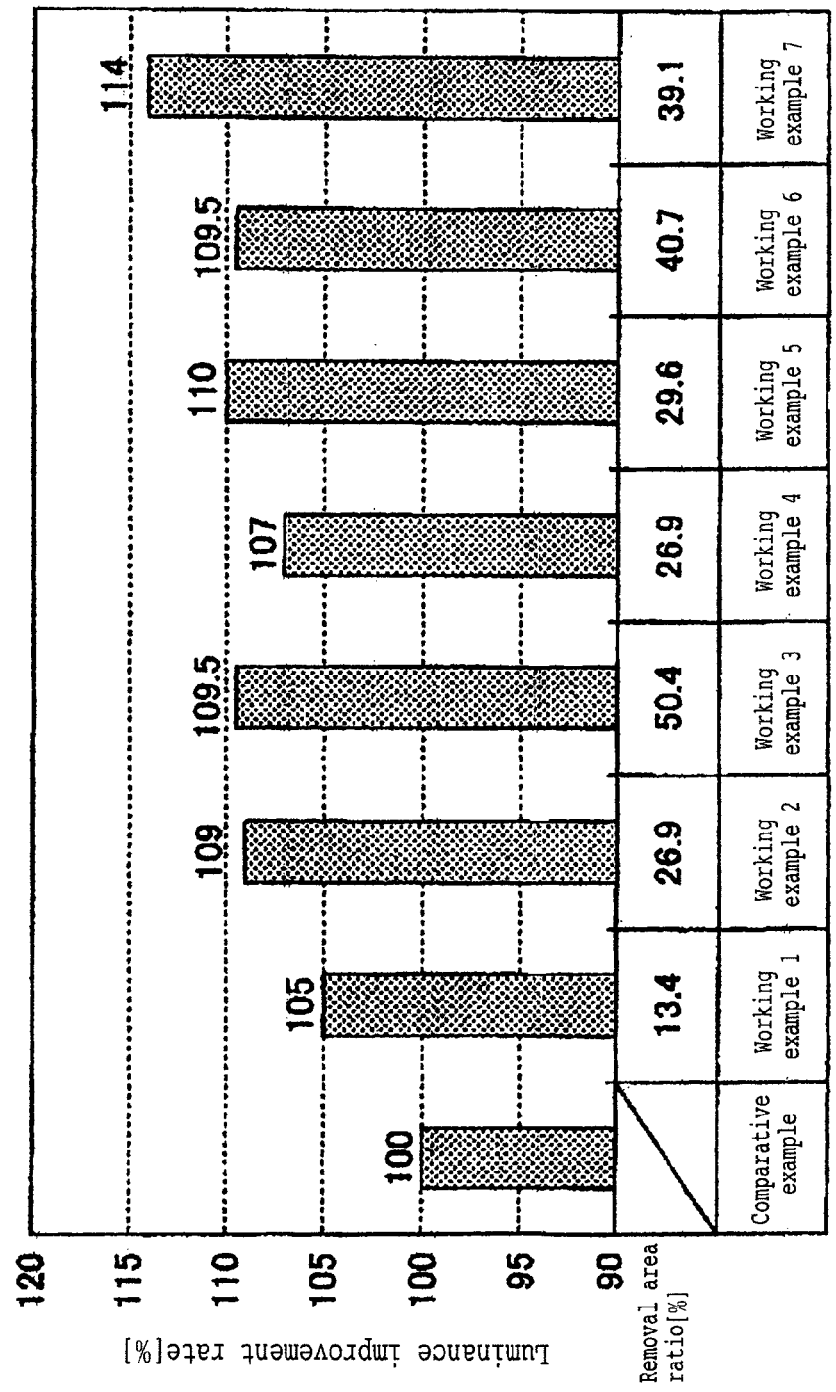

LIGHT EMITTING CHIP

BACKGROUND OF THE INVENTION

1. Field of the Invention

The present invention relates to a light emitting chip including a device chip in which a light emitting layer is formed.

2. Description of the Related Art

Light emitting devices including light emitting diode (LED), laser diode (LD), and so forth have been put into practical use. These light emitting devices normally include a light emitting chip having a device chip in which a light emitting layer that emits light by application of a voltage is formed. In manufacturing of this device chip, first an epitaxial layer (crystal layer) is grown as the light emitting layer in the respective areas partitioned by planned dividing lines in a lattice manner on a substrate for crystal growth. Thereafter, the substrate for crystal growth is divided along the planned dividing lines to be turned to individual pieces. Thereby, the device chips for individual light emitting chips are formed.

In the light emitting chip, in a device chip in which the light emitting layer that emits green or blue light is an InGaN-based material layer, sapphire is generally used as the substrate for crystal growth and an n-type GaN semiconductor layer, an InGaN light emitting layer, and a p-type GaN semiconductor layer are sequentially epitaxially grown over this sapphire substrate. Furthermore, an external lead-out electrode is formed for each of the n-type GaN semiconductor layer and the p-type GaN semiconductor layer.

The back surface side (sapphire substrate side) of this device chip is fixed to a lead frame and the front surface side (light emitting layer side) of the device chip is covered by a lens member. Thereby, a light emitting diode is formed. For such a light emitting diode, improvement in the luminance is considered as an important issue and various methods for enhancing the light extraction efficiency have been proposed before (refer to e.g. Japanese Patent Laid-open No. Hei 4-10670).

SUMMARY OF THE INVENTION

Light generated in the light emitting layer by application of a voltage is emitted mainly from two major surfaces (front surface and back surface) of a layer stack including the light emitting layer. For example, the light emitted from the front surface of the layer stack (major surface on the lens member side) is extracted to the external of the light emitting diode via the lens member and so forth. Meanwhile, the light emitted from the back surface of the layer stack (major surface on the sapphire substrate side) travels in the sapphire substrate and part thereof is reflected at the interface between the sapphire substrate and the lead frame and so forth to return to the layer stack.

For example, if a thin sapphire substrate is used for the device chip for the purpose of improvement in the processability in cutting and so forth, the distance between the back surface of the layer stack and the interface between the sapphire substrate and the lead frame is short. In this case, the ratio of light reflected at the interface between the sapphire substrate and the lead frame to return to the layer stack is higher than that when the sapphire substrate is thick. The layer stack absorbs light. Therefore, when the ratio of light that returns to the layer stack is higher as above, the light extraction efficiency of the light emitting diode is lower.

Therefore, an object of the present invention is to provide a light emitting chip that allows enhancement in the light extraction efficiency.

In accordance with an aspect of the present invention, there is provided a light emitting chip having a device chip including a light emitting layer on a front surface side thereof and a transparent member that is bonded to a back surface of the device chip by a transparent resin and is transmissive to light emitted from the light emitting layer. In the light emitting chip, a groove is formed in an abutting surface of the transparent member against the device chip in such a manner as to be exposed to a side surface and the abutting surface of the transparent member, and the groove width of the groove is smaller than the length of a long side of the device chip.

According to this configuration, the groove is formed in the abutting surface against the device chip in the transparent member bonded to the back surface of the device chip. Therefore, the refractive index of the space inside the groove can be set lower than that of the transparent member and the range of the incident angle for total reflection about light incident on the groove can be made wider than light incident on the transparent member. This can suppress the ratio of light reflected to return to the light emitting layer after being transmitted through the transparent member to a low ratio and increase the ratio of light going out of the device chip, which can enhance the light extraction efficiency. Moreover, light scattering can be caused at the time of incidence on the groove and output from the groove and the ratio of light going out from the side surface of the transparent member can be increased.

Preferably, the groove is formed at 20 to 50% of a removal area ratio to the abutting surface. This removal area ratio can improve the luminance of the light emitting chip and favorably keep the stability of the mounting between the device chip and the transparent member.

Preferably, the groove is formed into a cross shape in the abutting surface of the transparent member. This configuration can enhance the light extraction efficiency more favorably.

Preferably, the device chip is formed by stacking the light emitting layer formed of a GaN semiconductor layer over a sapphire substrate. This configuration can enhance the light extraction efficiency in the light emitting chip that emits blue or green light. Furthermore, even when the sapphire substrate is set thin, reflected light can be made incident on a position outside the light emitting layer according to the thickness of the transparent member. Therefore, the thin sapphire substrate can be utilized without the lowering of the light extraction efficiency, which can keep favorable processability provided by the thin substrate for crystal growth.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 6 is a graph showing measurement results of the luminance improvement rate of the comparative example and working examples 1 to 7.

DETAILED DESCRIPTION OF THE PREFERRED EMBODIMENT

Figure 1:
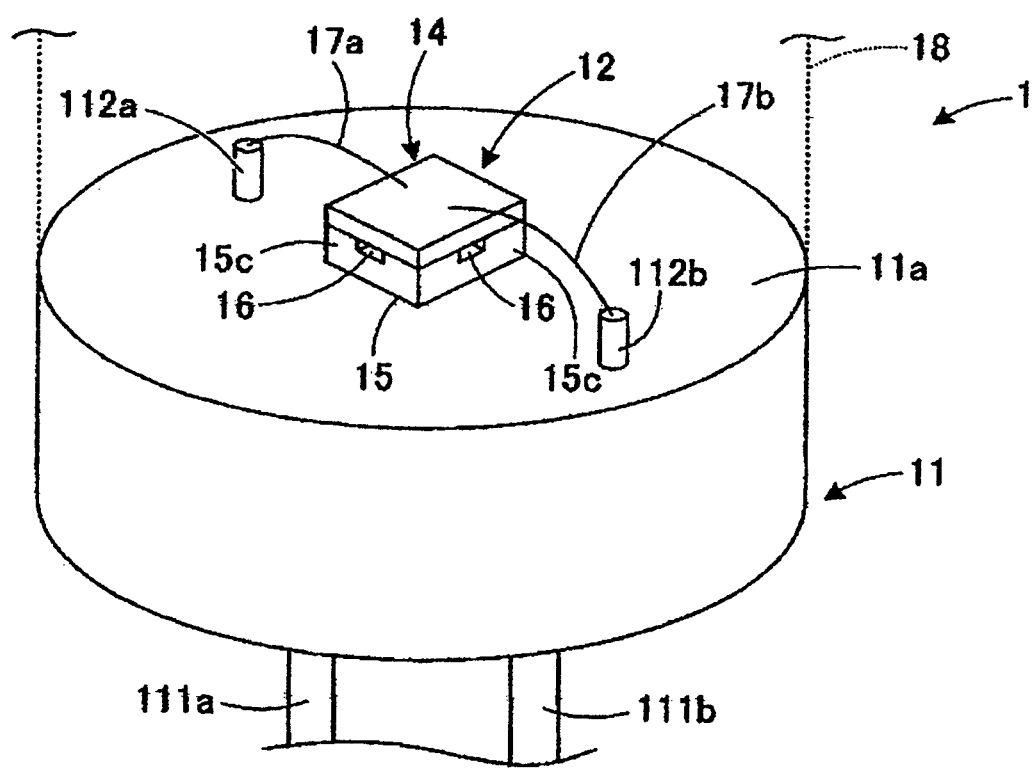
FIG. 1 is a perspective view schematically showing a configuration example of a light emitting diode according to an embodiment.
Figure 2:
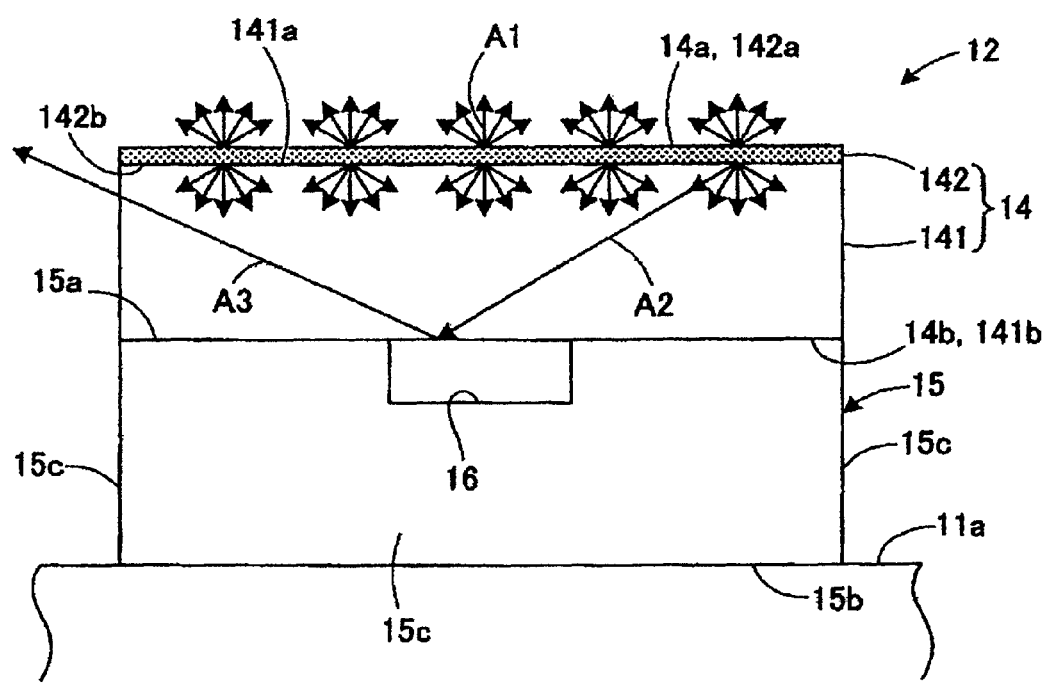
FIG. 2 is a schematic sectional view showing how light is emitted in the light emitting diode.

An embodiment of the present invention will be described below with reference to the accompanying drawings. FIG. 1 is a perspective view schematically showing a configuration example of a light emitting diode according to the embodiment. FIG. 2 is a schematic sectional view showing how light is emitted from a light emitting chip of the light emitting diode according to the embodiment. As shown in FIG. 1, a light emitting diode 1 includes a lead frame 11 serving as a base and a light emitting chip 12 supported and fixed by the lead frame 11.

The lead frame 11 is formed into a circular column shape by a material such as a metal and has two lead members 111a and 111b having electrical conductivity on a back surface side thereof, the back surface being equivalent to one major surface thereof. The lead members 111a and 111b are insulated from each other and function as the anode and cathode, respectively, of the light emitting diode 1. The lead members 111a and 111b are connected to an external power supply (not shown) via wiring (not shown) and so forth.

On a front surface 11a equivalent to the other major surface of the lead frame 11, two connection terminals 112a and 112b insulated from each other are disposed at a predetermined interval. The connection terminal 112a is connected to the lead member 111a inside the lead frame 11. The connection terminal 112b is connected to the lead member 111b inside the lead frame 11. Therefore, the potentials of the connection terminals 112a and 112b are equivalent to the potentials of the lead members 111a and 111b, respectively.

A light emitting chip 12 is disposed on the front surface 11a of the lead frame 11 and between the connection terminal 112a and the connection terminal 112b. As shown in FIG. 2, the light emitting chip 12 has a device chip 14 and a transparent member 15 bonded to a back surface 14b of this device chip 14. The device chip 14 includes a sapphire substrate 141 having a rectangular shape as its planar shape and a layer stack 142 provided on a front surface 141a of the sapphire substrate 141. The layer stack 142 includes plural semiconductor layers formed by using GaN-based semiconductor materials (GaN semiconductor layers).

The layer stack 142 is formed by sequentially epitaxially growing an n-type semiconductor layer (e.g. n-type GaN layer), in which electrons are the majority carriers, a semiconductor layer (e.g. InGaN layer) to serve as a light emitting layer, and a p-type semiconductor layer (e.g. p-type GaN layer), in which holes are the majority carriers. Furthermore, on the sapphire substrate 141, two electrodes (not shown) that are connected to the n-type semiconductor layer and the p-type semiconductor layer, respectively, and apply a voltage to the layer stack 142 are formed. These electrodes may be included in the layer stack 142.

The transparent member 15 is formed of a sapphire substrate and is so configured as to allow light emitted from the light emitting layer to be transmitted through the transparent member 15. It is preferable for the transparent member 15 to have a thickness equivalent to or larger than that of the sapphire substrate 141. The front surface of the transparent member 15 serves as an abutting surface 15a that abuts against the back surface 14b of the device chip 14 and the abutting surface 15a is bonded to the back surface 14b of the device chip 14 by a resin (not shown). This resin is composed of a transparent resin material such as a die bonding agent through which light emitted from the light emitting layer is transmitted. A back surface 15b of the transparent member 15 is bonded to the front surface 11a of the lead frame 11 by the same resin (not shown) as the above-described resin.

The outline shapes of the abutting surface 15a and the back surface 15b of the transparent member 15 are each formed into substantially the same rectangular shape as the device chip 14 in plan view, and these surfaces are disposed in parallel to each other. The transparent member 15 has four side surfaces 15c each linking a respective one of the four sides of the abutting surface 15a with a respective one of the four sides of the back surface 15b. Each side surface 15c is formed perpendicular to the abutting surface 15a and the back surface 15b.

Figure 3:
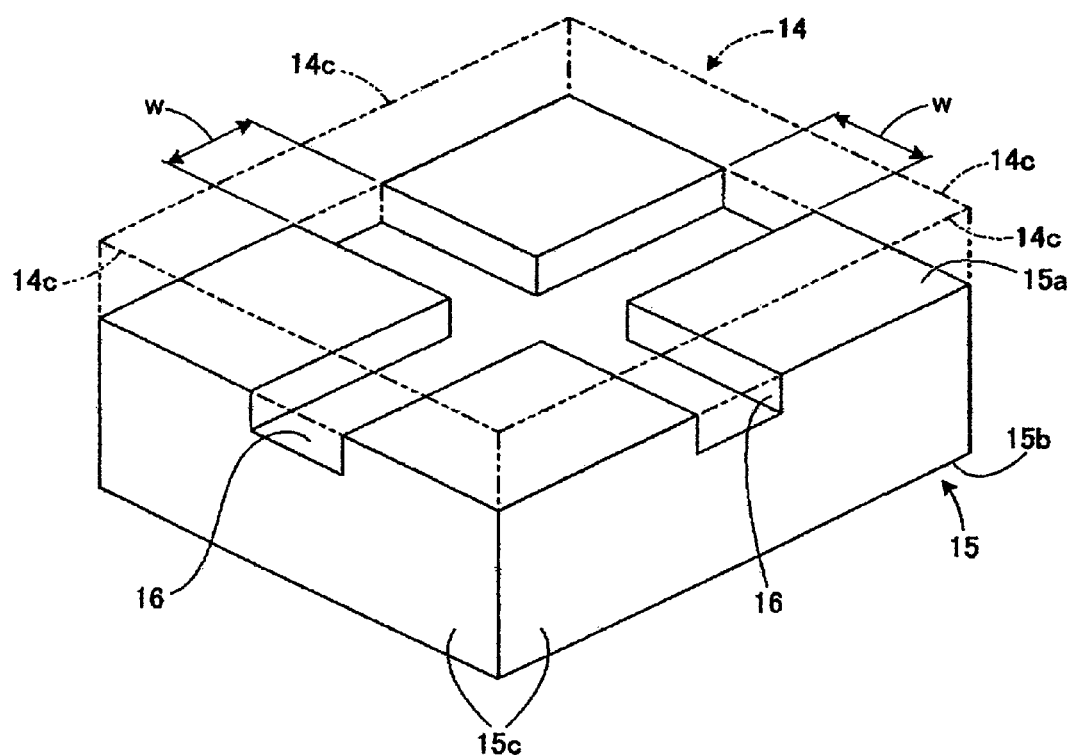
FIG. 3 is a schematic perspective view of a transparent member included in the light emitting diode.

FIG. 3 is a schematic perspective view of the transparent member as viewed from above. As shown in FIG. 3, grooves 16 are formed in the abutting surface 15a of the transparent member 15. In the present embodiment, two grooves 16 are formed in a cross manner. Specifically, the grooves 16 are so formed as to each extend in parallel to the respective two of the four sides forming the abutting surface 15a and be orthogonal to each other. Both ends of each groove 16 in the extension direction are located and opened at the center of the respective two of the four sides forming the abutting surface 15a. Thus, both ends of each groove 16 in the extension direction are exposed to the side surfaces 15c of the transparent member 15. Each groove 16 is so formed that the abutting surface 15a is partially removed from above, and is exposed also to the abutting surface 15a of the transparent member 15.

A groove width w of the groove 16 is set smaller than the length of one side 14c as the long side of the four sides of the device chip 14. Furthermore, it is preferable that the ratio of the area where the groove 16 is formed to the whole area of the abutting surface 15a of the transparent member 15 (hereinafter, referred to as the "removal area ratio") is set to about 20% to 50%. The groove 16 is not limited to two grooves in a cross manner. For example, one of the two grooves 16 may be omitted and only one groove 16 may be formed in the abutting surface 15a, or two grooves 16 may be formed in parallel at a predetermined interval. Furthermore, as long as the groove width w is smaller than the length of one side 14c of the device chip 14 and the groove 16 is exposed to the abutting surface 15a and the side surface 15c of the transparent member 15, three or more grooves 16 may be formed or the angle of two intersecting grooves 16 may be set to an angle other than a right angle.

Referring back to FIG. 1, the two connection terminals 112a and 112b provided on the lead frame 11 are connected to the two electrodes of the light emitting chip 12 via lead wires 17a and 17b, respectively, having electrical conductivity. Due to this, the voltage of the power supply connected to the lead members 111a and 111b is applied to the layer stack 142 (see FIG. 2). When the voltage is applied to the layer stack 142, electrons flow from the n-type semiconductor layer and holes flow from the p-type semiconductor layer into the semiconductor layer serving as the light emitting layer. As a result, the recombination of the electrons and the holes occurs in the semiconductor layer serving as the light emitting layer and light having a predetermined wavelength is emitted. In the present embodiment, because the semiconductor layer serving as the light emitting layer is formed by using a GaN-based semiconductor material, blue or green light corresponding to the band gap of the GaN-based semiconductor material is emitted.

A dome-shaped lens member 18 covering the side of a front surface 14a of the device chip 14 is attached to the circumferential edge of the lead frame 11 on the side of the front surface 11a. The lens member 18 is formed of a material, such as a transparent resin, having a predetermined refractive index and refracts the light emitted from the layer stack 142 of the device chip 14 to guide the light to the external of the light emitting diode 1 in predetermined directions. In this manner, the light emitted from the device chip 14 is extracted to the external of the light emitting diode 1 via the lens member 18.

Figure 4:
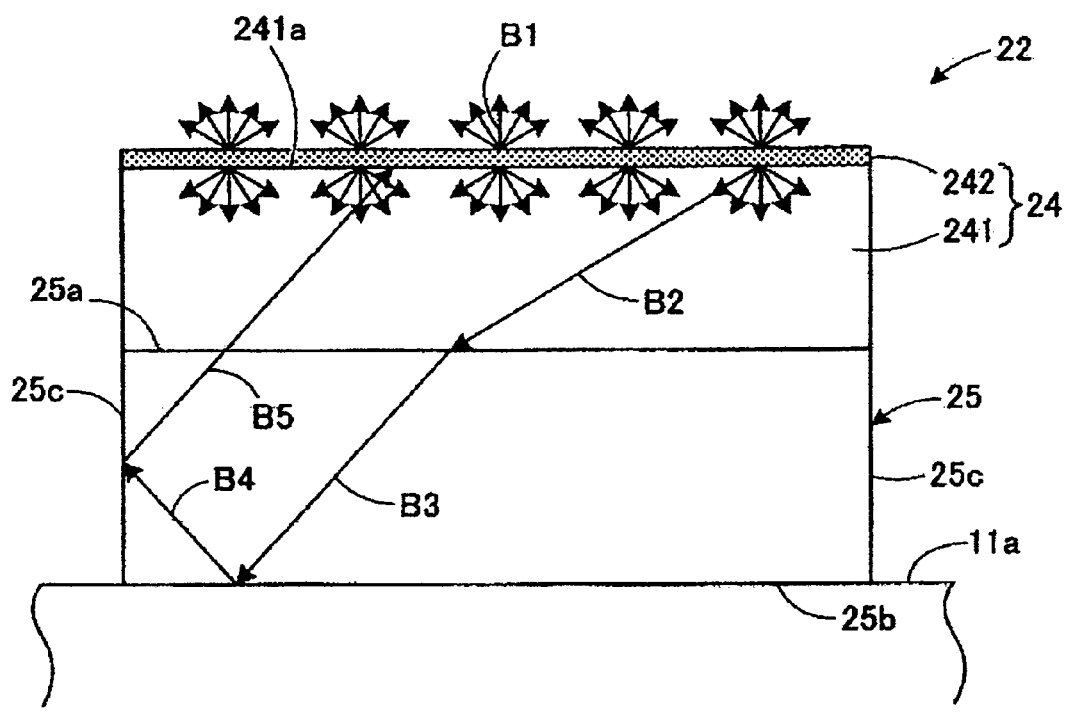
FIG. 4 is a schematic sectional view showing how light is emitted in a light emitting diode according to a comparative structure.

Next, description will be made about a luminance improvement effect by the light emitting diode 1 according to the embodiment with reference to a light emitting diode according to a comparative structure of FIG. 4. FIG. 4 is a schematic sectional view showing how light is emitted from a light emitting chip of the light emitting diode according to the comparative structure for making a comparison with the embodiment. The light emitting diode according to the comparative structure has a configuration in common with the light emitting diode 1 according to the embodiment except for that the shape of the transparent member 15 is different. Specifically, in a light emitting chip 22 according to the comparative structure, a device chip 24 including a sapphire substrate 241 having a rectangular shape as its planar shape and a layer stack 242 provided on a front surface 241a of the sapphire substrate 241 is bonded to an abutting surface 25a of a transparent member 25. However, the groove 16 like that in the embodiment is not formed in the abutting surface 25a of the transparent member 25 and the abutting surface 25a is formed into a shape of a flat surface parallel to a back surface 25b.

As shown in FIG. 2, in the light emitting chip 12 according to the embodiment, light generated in the semiconductor layer serving as the light emitting layer is emitted mainly from a front surface 142a of the layer stack 142 (i.e. the front surface 14a of the device chip 14) and a back surface 142b. The light emitted from the front surface 142a of the layer stack 142 (e.g. optical path A1) is extracted to the external of the light emitting diode 1 via the lens member 18 (see FIG. 1) and so forth as described above. On the other hand, e.g. light emitted from the back surface 142b of the layer stack 142 to travel on an optical path A2 is incident on the back surface 14b of the device chip 14, which is the interface between the sapphire substrate 141 and an air layer formed in the groove 16, and is totally reflected (optical path A3). The light traveling on the optical path A3 is incident on a side surface of the sapphire substrate 141 to be emitted to the external.

As shown in FIG. 4, optical paths B1 and B2 in the light emitting chip 22 according to the comparative structure are the same as the optical paths A1 and A2 in the light emitting chip 12 according to the embodiment. However, whereas the light traveling on the optical path A2 in the embodiment is totally reflected at the back surface 14b of the device chip 14 due to the groove 16 and travels on the optical path A3, the light traveling on the optical path B2 in the comparative structure is transmitted to the transparent member 25 and travels on an optical path B3. The light traveling on the optical path B3 is reflected at the front surface 11a of the lead frame 11 (optical path B4). The light traveling on the optical path B4 is totally reflected at the interface between a side surface 25c of the transparent member 25 and an air layer (optical path B5). The light totally reflected to travel on the optical path B5 is transmitted through the transparent member 25 and then the sapphire substrate 241 to be incident on the layer stack 242 and be absorbed. Thus, the light cannot be extracted to the external.

As described above, in the light emitting diode 1 according to the embodiment, the refractive index of the space inside the groove 16 can be set lower than that of the transparent member 15, and the range of the incident angle for total reflection of light incident on the groove 16 can be made wider than that of light incident on the transparent member 15. Therefore, light that is emitted from the layer stack 142 toward the groove 16 and travels as on the optical path A2 can be extracted to the external as on the optical path A3. Due to this, for the light traveling as on the optical path A2, the ratio of light totally reflected at the back surface 14b of the device chip 14 can be increased compared with the light traveling as on the optical path B2 in the comparative structure. As a result, the ratio of light that is repeatedly reflected inside the transparent member 15 and so forth and returns to the layer stack 142 can be made lower and the ratio of light going out of the sapphire substrate 141 can be made higher, which can enhance the light extraction efficiency and achieve improvement in the luminance. Furthermore, in the present embodiment, the light emitted from the layer stack 142 to travel as on the optical path A2 can be scattered in the groove 16 and part of the light can be extracted to the external after traveling in the sapphire substrate 141 and the transparent member 15. This can also suppress the ratio of light returning to the layer stack 142 to a low ratio.

The sapphire substrate is not easy to process because being hard and therefore it is preferable to use a thin sapphire substrate to enhance the processability. In the above-described light emitting diode 1, the light extraction efficiency can be kept high by the transparent member 15 even when the thickness of the sapphire substrate 141 is set small. That is, there is no need to set the thickness of the sapphire substrate 141 large for keeping the light extraction efficiency to sacrifice the processability.

Figure 5:
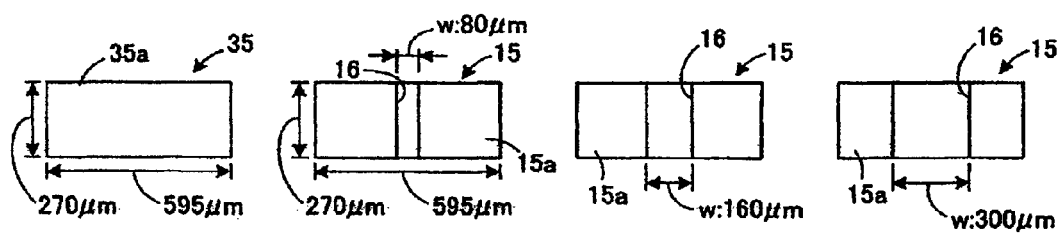
FIG. 5 is a plan view of transparent members according to working examples 1 to 7 and a comparative example.
Figure 5:
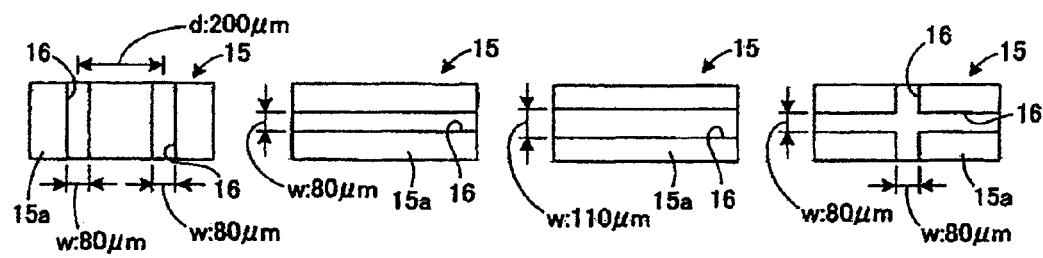

Next, an experiment carried out in order to check the luminance improvement effect of the light emitting diode according to the above-described embodiment will be described. In this experiment, light emitting diodes having the transparent members 15 and 35 with configurations shown in FIG. 5 were fabricated as working examples 1 to 7 and a comparative example. The light emitting diode of working example 1 was given the same configuration as the light emitting diode 1 of the above-described embodiment (see FIG. 1) except for that the form of the groove 16 was changed, and a die bonding agent through which light is transmitted (KER-M2 made by Shin-Etsu Chemical Co., Ltd.) was used as the transparent resin (not shown) to bond the transparent member 15 to the device chip 14. The size (vertical×horizontal×thickness) of the device chip 14 was set to 270 μm×595 μm×150 μm. The size of the transparent member 15 was set identical to that of the device chip 14. Specifically, a sapphire substrate whose area (vertical×horizontal) of the abutting surface 15a was set to 270 μm×595 μm and whose thickness was set to 150 μm was used as the transparent member 15.

As the groove 16 in working example 1, one groove extended along the vertical direction (short side direction) at the center part in the horizontal direction (long side direction). The groove width w thereof was set to 80 μm. Working examples 2 and 3 were made by changing the groove width W of the groove 16 in working example 1. The groove width w in working example 2 was set to 160 μm and the groove width w in working example 3 was set to 300 μm. In working example 4, two grooves 16 in working example 1 were made and a separation distance d between the groove width center points of the respective grooves 16 in the horizontal direction was set to 200 µm. As the groove 16 in working examples 5 and 6, one groove extended along the horizontal direction at the center part in the vertical direction. The groove width w in working example 5 was set to 80 µm and the groove width w in working example 6 was set to 110 µm. As the grooves 16 in working example 7, both of the respective grooves 16 in working examples 1 and 5 were formed in a cross manner. The depth of all of the grooves 16 in working examples 1 to 7 was set to 40 µm. In the comparative example, the formation of the groove 16 in working example 1 was omitted and an abutting surface 35a of the transparent member 35 was formed into a flat surface shape.

In this experiment, the luminance of the light emitting diodes of the respective working examples and the comparative example was measured. Specifically, the total value of the intensity (power) of all light radiated from each light emitting device was measured (total radiant flux measurement) and was converted into the luminance improvement rate calculated with the comparative example, in which the groove 16 was not formed, regarded as the criterion (100%). FIG. 6 is a graph showing the measurement results. In FIG. 6, the ordinate indicates the luminance improvement rate (%) of each light emitting diode. Furthermore, in FIG. 6, the removal area ratio in each working example is shown by percentage [%].

As shown in FIG. 6, compared with the comparative example as the criterion (100%), the luminance was improved and the light extraction efficiency could be enhanced in all of working examples 1 to 7, in which the groove 16 was formed in the transparent member 15. In particular, in working example 5 (29.6% of removal area ratio), working example 6 (40.7%), and working example 3 (50.4%), in which the removal area ratio of the groove 16 was about 20 to 50%, the luminance improvement rate was about 110% and thus the tendency that the luminance was enhanced could be confirmed. Furthermore, although the removal area ratio showed close values in working example 6 (40.7%) and working example 7 (39.1%), the luminance improvement rate in working example 7 was higher than that in working example 6 by 4.5% and thus it could be confirmed that the luminance was improved by forming the grooves 16 into the cross shape. When the removal area ratio of the groove 16 was set higher than 50%, the area of the abutting surface 15a with respect to the back surface 14b of the device chip 14 became small and the stability of bonding between them easily became insufficient. Therefore, considering both this bonding stability and the luminance improvement comprehensively, the optimum removal area ratio of the groove 16 is about 40%.

The present invention is not limited to the above-described embodiment and can be carried out with various changes. The sizes, shapes, and so forth of constituent elements in the above-described embodiment are not limited to those illustrated in the accompanying drawings and can be arbitrarily changed within such a range as to exert effects of the present invention. Besides, the present invention can be carried out with arbitrary changes without departing from the scope of the object of the present invention.

For example, in the above-described embodiment, the device chip 14 using a sapphire substrate and a GaN-based semiconductor material is exemplified. However, the substrate for crystal growth and the semiconductor material are not limited to the embodiment. For example, a GaN substrate may be used as the substrate for crystal growth. Although it is preferable to reduce the thickness of the substrate for crystal growth, such as a sapphire substrate, to enhance the processability, the substrate for crystal growth does not necessarily need to be thin.

Furthermore, although the layer stack 142 in which an n-type semiconductor layer, a semiconductor layer that emits light, and a p-type semiconductor layer are sequentially provided is exemplified in the above-described embodiment, the configuration of the layer stack 142 is not limited thereto. It is enough for the layer stack 142 to be so configured as to be capable of at least emission of light through the recombination of electrons and holes.

In addition, the device chip 14 may be a device chip that emits infrared light (AlGaAs, GaAsP, or the like). In this case, the same effects as those of the above-described embodiment are obtained by forming the transparent member 15 by a material transmissive to infrared light. Moreover, the same effects as those of the above-described embodiment are obtained also when the device chip 14 emits ultraviolet light and the transparent member 15 is formed by a material transmissive to ultraviolet light.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A light emitting chip comprising:
    a device chip having a light emitting layer on a front surface side thereof; and
    a transparent member that is bonded to a back surface of the device chip by a transparent resin and is transmissive to light emitted from the light emitting layer, wherein
    a groove is formed in an abutting surface of the transparent member against the device chip in such a manner as to be exposed to a side surface and the abutting surface of the transparent member, and groove width of the groove is smaller than length of a long side of the device chip.
2. The light emitting chip according to claim 1, wherein the groove is formed at 20 to 50% of a removal area ratio to the abutting surface.
3. The light emitting chip according to claim 2, wherein the groove is formed into a cross shape in the abutting surface of the transparent member.
4. The light emitting chip according to claim 1, wherein the device chip is formed by stacking the light emitting layer formed of a GaN semiconductor layer over a sapphire substrate.

* * * * *